US012754259B2

(12) United States Patent
David et al.

(10) Patent No.: US 12,754,259 B2

(45) Date of Patent: Oct. 6, 2026

(54) LOW-POWER SENSORS UTILIZING WIEGAND COILS

(71) Applicant: Allegro MicroSystems, LLC, Manchester, NH (US)

(72) Inventors: Paul A. David, Bow, NH (US); Alexander Latham, Harvard, MA (US); Ronald Lehndorff, Mainz (DE)

(73) Assignee: Allegro MicroSystems, LLC, Manchester, NH (US)

( * ) Notice: Subject to any disclaimer, the term of this patent is extended or adjusted under 35 U.S.C. 154(b) by 178 days.

(21) Appl. No.: 18/754,868

(22) Filed: Jun. 26, 2024

(65) Prior Publication Data

US 2026/0003015 A1 Jan. 1, 2026

(51) Int. Cl.

*G01R 33/07* (2006.01)
*G01R 33/09* (2006.01)
*H02J 50/00* (2016.01)
*H02J 50/10* (2016.01)

(52) U.S. Cl.

CPC ........... *G01R 33/07* (2013.01); *G01R 33/093* (2013.01); *G01R 33/096* (2013.01); *G01R 33/098* (2013.01); *H02J 50/001* (2020.01); *H02J 50/10* (2016.02)

(58) Field of Classification Search

None

See application file for complete search history.

(56) References Cited

U.S. PATENT DOCUMENTS

| | | | |
|---|---|---|---|
| 3,863,153 A | 1/1975 | Eshraghian | |
| 4,196,391 A | 4/1980 | Weber | |
| 5,493,218 A | 2/1996 | Hayashi et al. | |
| 5,619,137 A | 4/1997 | Vig et al. | |
| 6,084,406 A | 7/2000 | James et al. | |
| 6,191,687 B1 * | 2/2001 | Dlugos .................. | G08C 17/02 340/552 |
| 6,194,896 B1 | 2/2001 | Takahashi et al. | |
| 6,229,299 B1 | 5/2001 | Strashny | |

(Continued)

FOREIGN PATENT DOCUMENTS

| | | |
|---|---|---|
| DE | 10320057 | 12/2004 |
| EP | 0 019 827 A1 | 12/1980 |
| EP | 3550269 | 10/2019 |

OTHER PUBLICATIONS

U.S. Appl. No. 18/891,237, filed Sep. 20, 2024, Fahmy.

(Continued)

*Primary Examiner* — Jas A Sanghera

(74) *Attorney, Agent, or Firm* — DALY, CROWLEY, MOFFORD & DURKEE, LLP

(57) ABSTRACT

Systems, structures, circuits, packages and methods provide low-power devices such as sensors and sensor packages having one or more Wiegand coils that can be used for activation of a sensor or other device, as well as potentially supplying operating power. In some embodiments, one or more Wiegand coils can be located in a sensor package, e.g., as one or more discrete components in the package and/or on formed on or connected to a semiconductor die within the package, for providing wake-up and/or continuous power. The Wiegand coil(s) can be separated from the sensor die in some embodiments. In some embodiments, the Wiegand coil(s) can be constructed on the die itself.

37 Claims, 4 Drawing Sheets

(56) References Cited

U.S. PATENT DOCUMENTS

| | | | | |
|---|---|---|---|---|
| 6,356,741 | B1 | 3/2002 | Bilotti et al. | |
| 6,424,182 | B1 | 7/2002 | Plagens | |
| 6,473,255 | B2 | 10/2002 | Hatanaka et al. | |
| 6,504,363 | B1 | 1/2003 | Dogaru et al. | |
| 7,148,642 | B2 | 12/2006 | Brannen et al. | |
| 7,268,526 | B1 | 9/2007 | Smith | |
| 7,405,554 | B2 | 7/2008 | Yao | |
| 8,008,908 | B2 | 8/2011 | Doogue et al. | |
| 8,222,888 | B2 | 7/2012 | David et al. | |
| 9,664,494 | B2 | 5/2017 | Fernandez et al. | |
| 10,345,417 | B2 | 7/2019 | Geisler | |
| 10,635,539 | B2 | 4/2020 | Cook et al. | |
| 10,852,161 | B2 | 12/2020 | Cesaretti et al. | |
| 11,624,799 | B2 | 4/2023 | Cesaretti et al. | |
| 12,111,153 | B2 | 10/2024 | Vuillermet et al. | |
| 2004/0100251 | A1 | 5/2004 | Lohberg | |
| 2005/0194964 | A1 | 9/2005 | Okada et al. | |
| 2006/0006864 | A1 | 1/2006 | Johnson et al. | |
| 2006/0071659 | A1 | 4/2006 | Tatschi et al. | |
| 2006/0076838 | A1* | 4/2006 | Solveson | G01R 15/183 324/117 H |
| 2006/0103547 | A1 | 5/2006 | Salser et al. | |
| 2008/0090683 | A1 | 4/2008 | Englert et al. | |
| 2008/0303513 | A1* | 12/2008 | Turner | G01P 3/488 324/160 |
| 2008/0315865 | A1 | 12/2008 | Doogue et al. | |
| 2010/0052424 | A1 | 3/2010 | Taylor et al. | |
| 2010/0052663 | A1* | 3/2010 | Mehnert | G01D 5/145 324/207.25 |
| 2011/0184691 | A1* | 7/2011 | Mehnert | G01P 3/4815 702/151 |
| 2011/0234215 | A1* | 9/2011 | Ausserlechner | G01R 15/20 324/244 |
| 2012/0268109 | A1* | 10/2012 | Mehnert | G01P 3/4815 324/207.13 |
| 2015/0130450 | A1* | 5/2015 | Gehringer | G01D 5/3473 324/207.25 |
| 2015/0142376 | A1 | 5/2015 | Ausserlechner | |
| 2017/0248445 | A1 | 8/2017 | Ausserlechner | |
| 2018/0051973 | A1* | 2/2018 | Schrubbe | G01D 5/145 |
| 2019/0316934 | A1* | 10/2019 | Chong | G01D 5/14 |
| 2021/0072016 | A1 | 3/2021 | Kollmitzer et al. | |
| 2021/0131586 | A1* | 5/2021 | Larsen | F16K 37/0033 |
| 2021/0156664 | A1 | 5/2021 | Binder et al. | |
| 2022/0075008 | A1 | 3/2022 | Romero | |
| 2022/0357144 | A1 | 11/2022 | Tombez | |
| 2023/0003503 | A1 | 1/2023 | Cesaretti et al. | |
| 2023/0152393 | A1 | 5/2023 | Haas et al. | |

OTHER PUBLICATIONS

U.S. Appl. No. 18/428,150, filed Jan. 31, 2024, Gurcan et al.

Extended European Search Report dated Oct. 12, 2022 for European Application No. EP22168908.6; pages.

Office Action dated Dec. 29, 2022, for U.S. Appl. No. 17/363,732; 9 pages.

Notice of Allowance dated Jan. 13, 2023, for U.S. Appl. No. 17/380,244; 14 pages.

Office Action dated Jun. 20, 2024, for U.S. Appl. No. 17/525,224; 26 pages.

Office Action dated Dec. 6, 2023, for U.S. Appl. No. 17/525,224; 18 pages.

Office Action dated May 25, 2023, for U.S. Appl. No. 17/525,224; 17 pages.

Notice of Allowance dated Sep. 30, 2024, for U.S. Appl. No. 17/525,224; 12 pages.

Response to Office Action dated Jun. 20, 2024, for U.S. Appl. No. 17/525,224; Response filed Sep. 18, 2024; 11 pages.

Response to Office Action dated Dec. 6, 2023, for U.S. Appl. No. 17/525,224; Response filed Feb. 28, 2024; 20 pages.

Response to Office Action dated May 25, 2023, for U.S. Appl. No. 17/525,224; Response filed Aug. 24, 2023; 15 pages.

Notice of Allowance dated Mar. 28, 2012, for U.S. Appl. No. 12/239,881; 8 pages.

Office Action dated Nov. 8, 2010, for U.S. Appl. No. 12/239,881; 12 pages.

Office Action dated Apr. 12, 2011, for U.S. Appl. No. 12/239,881; 10 pages.

Office Action dated Oct. 18, 2011, for U.S. Appl. No. 12/239,881; 10 pages.

Response to Office Action dated Nov. 8, 2010, for U.S. Appl. No. 12/239,881; Response filed Feb. 8, 2011; 12 pages.

Response to Office Action dated Apr. 12, 2011, for U.S. Appl. No. 12/239,881; Response filed Jul. 8, 2011; 17 pages.

Response to Office Action dated Oct. 18, 2011, for U.S. Appl. No. 12/239,881; Response filed Feb. 17, 2012; 13 pages.

International Search Report and Written Opinion dated Oct. 8, 2009, for International Application no. PCT/US2009/050459; 13 pages.

Chinese Office Action dated Jan. 25, 2011 for Chinese Patent Application No. 200880021801.9 and the English translation thereof, 11 pages.

Letter dated Mar. 2, 2011 in response to Chinese Office Action dated Jan. 25, 2011 for Chinese Patent Application No. 200880021801.9, 7 pages.

Office Action dated Mar. 28, 2011, from U.S. Appl. No. 11/767,549, filed Jun. 25, 2007, 7 pages.

Response to Office Action dated Mar. 28, 2011, from U.S. Appl. No. 11/767,549, filed Jun. 25, 2007, 8 pages.

Notice of Allowance dated Jun. 28, 2011, from U.S. Appl. No. 11/767,549, 6 pages.

Second Office Action dated Aug. 31, 2011, for Chinese Patent Application No. 200880021801.9 and the English translation thereof, 13 pages.

International Search Report and Written Opinion dated Oct. 1, 2008, for International Application No. PCT/US2008/062620; 13 pages.

Datasheet, Infineon Technologies, "TLE 4917, Low Power Hall Switch", Aug. 22, 2008 13 pages.

Datasheet, Diode Incorporated, "AH180, Micropower Omnipolar Hall-Effect Sensor Switch", Feb. 2007, 9 pages.

Datasheet, ELMOS Semiconductor AG, "E910.44, Ultra Low Power HALL-Sensor", Sep. 27, 2006, 5 pages.

Datasheet, IXYS, "MX887P, µPower Hall-Effect Switch" Jul. 19, 2007, 4 pages.

Datasheet, Panasonic, "AN48840B, AN48841B, Low current consumption, high sensitivity CMOS Hall IC Alternating magnetic field operation (For low-speed rotation detection)," Oct. 2006, 5 pages.

Datasheet, Toko, "Hall Sensor IC TK60011DS8/MC," undated, 12 pages.

Datasheet, Rohm, "BU52001GUL Hall Effect Switch," Apr. 2005, 6 pages.

Datasheet, Allegro Microsystems, Inc., "A3211, A3212 Micropower, Ultra-sensitive Hall-effect Switches," 2002, 2007, 12 pages.

Press Release and Datasheet, Allegro Microsystems, Inc., "A3422 Hall-Effect, Direction-Detection Sensors," undated, 11 pages.

Datasheet, E-CMOS, "EC2648-BL Cmos High Sensitivity Micropower Hall-Effect Switch," undated, 5 pages.

Datasheet, Diodes Incorporated, "AH1884 Micropower, Ultra-Sensitive Hall Effect Switch," Jul. 2007, 7 pages.

* cited by examiner

LOW-POWER SENSORS UTILIZING WIEGAND COILS

BACKGROUND

Operation of autonomous, standalone devices, such as sensors or so-called sensor "nodes," is typically constrained by available power. For example, for sensor nodes utilizing batteries, operation is limited in duration by the battery storage capacity. For devices, e.g., sensor nodes, employing energy-harvesting from the ambient environment, in addition to or instead of using batteries, operation may be limited by available energy from the environment.

SUMMARY

Aspect of the present disclosure are directed to and include sensors, sensor packages, and related methods, that provide and/or include a sensor for measuring a physical phenomenon and also one or more Wiegand sensors for low-power activation and/or operation.

One general aspect of the present disclosure includes a sensor package including: a sensor disposed in a package body and configured to produce an output signal indicative of a sensed physical phenomenon; an integrated circuit (IC) disposed on a semiconductor die disposed in the package body and configured to receive the output signal from the sensor; and a Wiegand sensor connected to the integrated circuit, where the Wiegand sensor includes a coil configured around a Wiegand wire, where the Wiegand sensor is configured to provide an energy pulse to the integrated circuit in response to a changing polarity of a sensed magnetic field.

Implementations may include one or more of the following features. The sensor may be disposed in the IC. The sensor may be disposed apart from the IC. The IC may be configured to switch from a low-power state to an active state in response to receiving the energy pulse from the Wiegand sensor. The IC may be configured to stay in the active state until receiving an off command. The IC may be configured to stay in the active state for a specified time. The specified time may be in accordance with a duty cycle. The Wiegand sensor may be disposed on the semiconductor die. The Wiegand sensor may include a discrete element disposed in the package body. The Wiegand sensor may include two or more coils configured to detect change in polarity of a sensed magnetic field in two or more respective directions. The sensor may include a magnetic field sensor. The magnetic field sensor may include one or more Hall effect elements. The magnetic field sensor may include one or more magnetoresistance (xMR) elements. The one or more xMR elements may include one or more tunneling magnetoresistance (TMR) elements. The one or more xMR elements may include one or more anisotropic magnetoresistance (AMR) elements. The one or more xMR elements may include one or more giant magnetoresistance (GMR) elements. The IC may include one or more memories. The one or more memories may include magnetic random access memory (MRAM). The sensor package may include a storage mechanism disposed in the package body and configured to store energy for use by the IC and/or sensor. The storage mechanism may include a battery disposed in the package body. The battery is disposed in the IC.

The Wiegand sensor may be configured to harvest energy from a host system producing one or more changing magnetic fields. The Wiegand sensor may include one or more Wiegand coils, each configured to detect a changing magnetic field and produce a corresponding output signal. Each changing magnetic field may be produced by relative motion between the respective Wiegand coil and a moving magnetic target of a host system. The host system may include a moving system with one or more moving components having angular motion, where each Wiegand coil of the Wiegand sensor is configured for operation at a respective frequency corresponding to the one or more moving components of the host system. The coil of the Wiegand sensor may be configured to reset the Wiegand wire to a known domain state after powerup to have a known North-to-South transition or South-to-North transition to be detected. Implementations of the described techniques may include hardware, a method or process, or computer software on a computer-accessible medium.

One general aspect of the present disclosure includes a method of making a sensor package. The method can include: providing a sensor disposed in a package body and configured to produce an output signal indicative of a sensed physical phenomenon; providing an integrated circuit (IC) disposed on a semiconductor die disposed in the package body and configured to receive the output signal from the sensor; and providing a Wiegand sensor connected to the integrated circuit, where the Wiegand sensor includes a coil configured around a Wiegand wire, where the Wiegand sensor is configured to provide an energy pulse to the integrated circuit in response to a changing polarity of a sensed magnetic field.

Implementations may include one or more of the following features. The IC may be configured to switch from a low-power state to an active state in response to receiving the energy pulse from the Wiegand sensor. The IC may be configured to stay in the active state until receiving an off command. The IC may be configured to stay in the active state for a specified time. The specified time may be in accordance with a duty cycle. The Wiegand sensor may be disposed on the semiconductor die. The Wiegand sensor may include a discrete element disposed in the package body. The Wiegand sensor may include two or more coils configured to detect change in polarity of a sensed magnetic field in two or more respective directions. The sensor may include a magnetic field sensor. The magnetic field sensor may include one or more Hall effect elements. The magnetic field sensor may include one or more magnetoresistance (xMR) elements. The sensor may be disposed in the IC. The sensor may be disposed apart from the IC.

Implementations of the described techniques, embodiments, and aspects may include hardware, a method or process, or computer software on a computer-accessible medium.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed examples and embodiments of the present disclose may be appreciated by reference to the figures of the accompanying drawings. In the figures like reference characters refer to like components, parts, elements, or steps/actions; however, similar components, parts, elements, and steps/actions may be referenced by different reference characters in different figures. It should be appreciated that the components and structures illustrated in the figures are not necessarily to scale, emphasis instead being placed upon illustrating the principles of the concepts described herein. Furthermore, examples and embodiments are illustrated by way of example and not limitation in the figures, in which.

DETAILED DESCRIPTION

Figure 1:
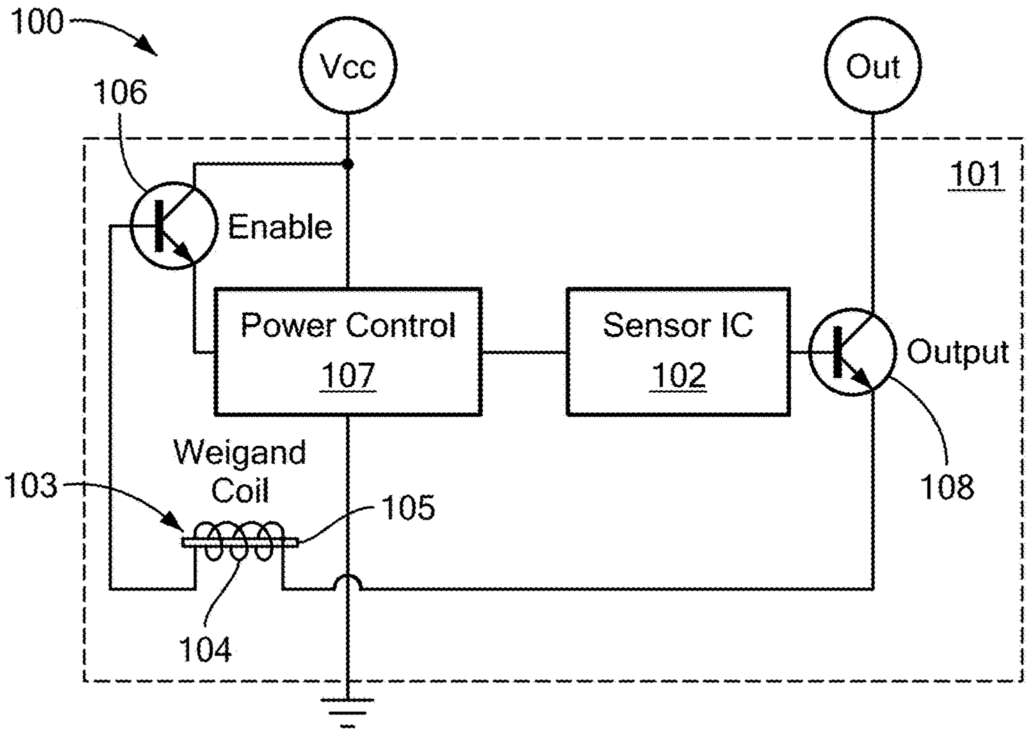
FIG. 1 shows a circuit diagram of an example low-power sensor including a Wiegand coil, in accordance with the present disclosure.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

As used herein, the term "magnetic field sensor" is used to describe a circuit that uses a magnetic field sensing element, generally in combination with other circuits. As used herein, the term "magnetic field sensing element" is used to describe a variety of electronic elements that can sense a magnetic field. The magnetic-field sensing element can be, but is not limited to, a Hall effect element, a magnetoresistance (xMR) element, a magnetotransistor or an inductive coil. As is known, there are different types of Hall effect elements, for example, a planar Hall effect element, a vertical Hall effect element, and a circular vertical Hall (CVH) effect element. As is also known, there are different types of magnetoresistance elements, for example, semiconductor magnetoresistance element such as Indium Antimonide (InSb), giant magnetoresistance (GMR) elements, anisotropic magnetoresistance (AMR) elements, and tunneling magnetoresistance (TMR) elements, a/k/a, magnetic tunnel junction (MTJ) elements.

The magnetic field sensing element may be a single element or, alternatively, may include two or more magnetic field sensing elements arranged in various configurations, e.g., a half bridge or full (Wheatstone) bridge, four elements on the sides or corners of a planar substrate, etc. Depending on the device type and other application requirements, a magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb); other materials (e.g., semiconductor alloys) may be used in other embodiments/applications.

Aspects of the present disclosure are directed to and include systems, structures, circuits, and methods providing low-power devices-such as sensors and sensor packages-having one or more Wiegand coils (a.k.a., "Wiegand sensors") that can be used for activation (wake-up) of the devices, as well as potentially supplying operating power. Wiegand sensors are magnetic sensors that do not need any external voltage or current and make use of the Wiegand effect to generate a consistent pulse every time magnetic field polarity reverses. Wiegand sensors typically include a coil wrapped around a Wiegand wire core (e.g., made or Vicalloy or similar alloy), which, due to the hysteresis inherent in the Wiegand effect, induces a pulse in the coil each time the magnetic polarity of the Wiegand wire core reverses.

The combination of the Wiegand coil(s) with one or more active sensors (transducers) allows for sensor devices that can operate with very-low-power consumption. In some embodiments, one or more Wiegand coils can be located in a sensor package, e.g., as one or more discrete components in the package and/or on formed on a semiconductor die within the package, for providing wake-up and/or continuous power. A Wiegand coil can be a separate structure/element or even constructed on a semiconductor die itself.

By implementing a Wiegand coil in system sensor, and then using the sensor in an environment or application that has an appropriately changing magnetic field, the Wiegand coil can "sense" the field, and use energy from the magnetic field to wake up a device. For example, in some embodiments, a North-to-South or South-to-North magnetic field transition (relative to the sensors alignment) will create a voltage pulse that then can harnessed by the system, e.g., in different formats or ways. Because such a signal is a self-created signal (harvested from the ambient magnetic environment), it can be used (without consuming power) to detect "something" happening. This detection can be used to power on a chip or system which will then consume power.

In some embodiments, a Wiegand coil can be included or implemented as a discrete element, e.g., on a substrate in a sensor package or other device. In some embodiments, a Wiegand coil can be formed on a semiconductor die (e.g., silicon die). In some embodiments, multiple coils can be implemented that, e.g., allow detection from multiple angles. Energy from a Wiegand coil can be used to initiate a "wake up" pulse to turn on a sensor to take a specified action. For example, the sensor could be woken up and caused to update an output status or send out a piece of information (wake up in response to Wiegand coil pulse, followed by "Device is now live"). In this case, e.g., the first pulse from coil would enable the first power on, then device is on until the power-off. Some embodiments may provide momentary or periodic operation then the device would shut down (go to sleep). A sensor device could stay on for a planned time or for an impulse operation In some embodiments, sensors and/or devices in accordance with the present disclosure can be low-power or very-low-power sensors and/or devices. Single or multiple Wiegand coils can be used for detecting magnetic fields produced by moving magnets or magnetic targets. For example, single or multiple coils configured in an X-plane and/or a Y-plane can be used to sense rotation. A device powered on can detect which coil "fired" to count rotations (left or right, totals or fractional, etc.). Such a configuration can utilize, e.g., a very-low-power CMOS counter, without a need for other active sensor circuits. Other embodiments can include an onboard energy storage mechanism, e.g., a battery, for the device. In some embodiments, a battery of some form may be deposited on a substrate or IC used with the Wiegand coil(s). In some embodiments, a battery may be co-packaged with a sensor and/or associated Wiegand coils. In some embodiments, Wiegand coils can both provide charge and be used for basic detection.

In some embodiments, sensors and/or devices in accordance with the present disclosure can operate as essentially "zero power" devices, obtaining needed operational power from the ambient environment. For example, single or multiple Wiegand coils and be used in layouts to harness energy form a "constantly moving" system. This can be used to power a device for different operational parameters. For example, one sensor can be run at first certain RPM, while another sensor can be run at a second RPM, etc. The sensor(s) can be passive devices where a Wiegand coil "fires" an output, resulting in an output frequency that changes relative to (or, alternatively, in step with) rotational speed. This could have multiple "generation" thresholds to detect different "speeds" of the system. For example, a flow meter with a rotating element sensing flow volume, could produce an output including a pulse width modulation (PWM) relative to the speed of rotation and or number of Wiegand coils and locations. As noted previously, in some embodiments, a battery may be co-packaged with a sensor and/or associated Wiegand coils. In some embodiments, Wiegand coils can both provide charge and be used for basic detection.

FIG. 1 shows a circuit diagram of an example low-power sensor 100 including a Wiegand coil, in accordance with the present disclosure. As shown, 100 can include a substrate 101 on which one or more sensors or sensing elements (indicated as 102) are disposed. A Wiegand sensor 103, including a coil 104 configured (wound) about a Wiegand wire, can be connected to a switch 106, as shown. Switch 106 can be connected to sensor 102, which may be included in a sensor integrated circuit (as indicated) or which may be connected to an integrated circuit. An output switch (transistor) 108 can also be included, as shown. Any suitable type of substrate may be used for substrate 101. For example, in some embodiments, substrate 101 may be or include a printed circuit board (PCB). Sensor 100 can be included in a package (not shown), e.g., having a package body including encapsulant and/or molding material that encapsulates or over-molds sensor 100.

Figure 2:
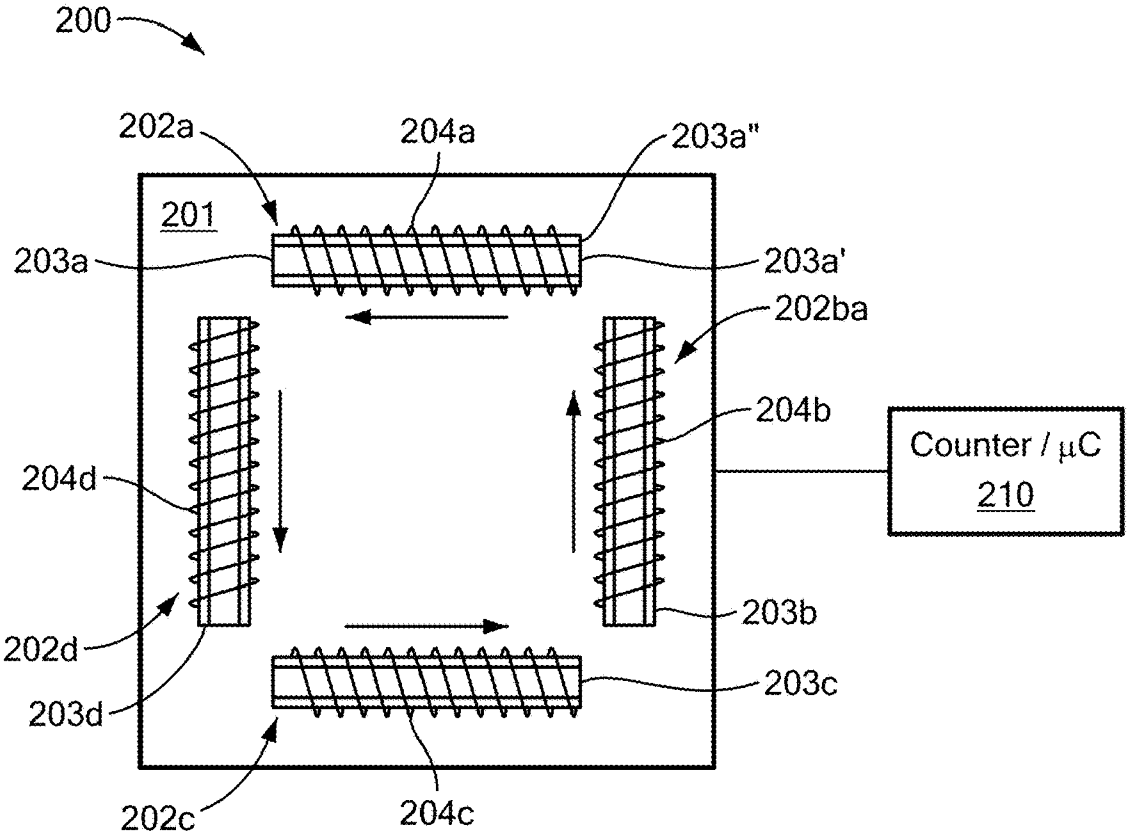
FIG. 2 shows an example configuration of Wiegand sensors, in accordance with the present disclosure.

FIG. 2 shows an example configuration 200 of Wiegand sensors, in accordance with the present disclosure. Configuration 200 can include a substrate 201 with multiple Wiegand sensors (a.k.a., "Wiegand coils") 202*a-d*. Each sensor 202*a-d* includes a Wiegand wire 203*a-d*, around which a coil 204*a-d* is configured (wound). Each Wiegand wire 203*a-d* incudes an inner portion (e.g., portion 203') surrounded by an outer portion (e.g., portion 203*a*"). In some embodiments, the inner portion (e.g., inner portion 203*a*') is ferromagnetically hard (has a relatively high coercivity) while the outer portion (e.g., outer portion 203*a*") is ferromagnetically soft (has a relatively low coercivity). In some embodiments, the Wiegand sensors 202*a-d* can be connected (individually or collectively) to one or more counters or microcontrollers 210, as indicated.

Sensors and other devices having a configuration of multiple Wiegand coils, e.g., as shown in FIG. 2, can harvest energy from the ambient environment in some situations or application, e.g., such as in proximity to spinning magnets or one or more alternating magnetic fields. Energy can accordingly be harvested by such sensors and devices, in a way that can wake the device up to send out a pulse with no power needed; or, with sufficient rate of magnetic change, run a device completely with more electronic components. For example, a sensor device can be coupled with a small storage battery or capacitor to allow charging when excess energy exists to run when the rate of magnetic change in the system is not frequent enough. The device could essentially be an "almost zero power" device that has a battery and is only awakened when events occur to allow turns counting when batteries are disconnected. This could be many, many turns of counting with simple digital counters. In some embodiments, on board (e.g., PCB) Wiegand coils and batteries can be utilized, e.g., with both deposited on top of the silicon die. In some embodiments, stacked die or other methods can be used.

The Wiegand coil produces an output pulse (transitions or fires) in response to a polarity change, i.e., North-to-South or South-to-North magnetic transitions, but this may not always be determinative for a sensor. Accordingly, in some embodiments, there can be a control loop on monitoring a Wiegand coil output as well as using the same coil to reset the "Wiegand wire" in the system. The "core" of the Wiegand sensor is the "Wiegand wire." In some embodiments, after an event is detected, the Wiegand coil with a current pulse cand be used to reset all the coils (or possible the known to have "fired" pairs) to a known state to be ready to sense again. In some embodiments, multiple coils to create a rudimentary counter with wake-up, combined with a battery (both discretely package and/or on die) to make a "virtually zero power" device, and high speed system where energy harvesting could occur to have a "true zero power" device.

Figure 3:
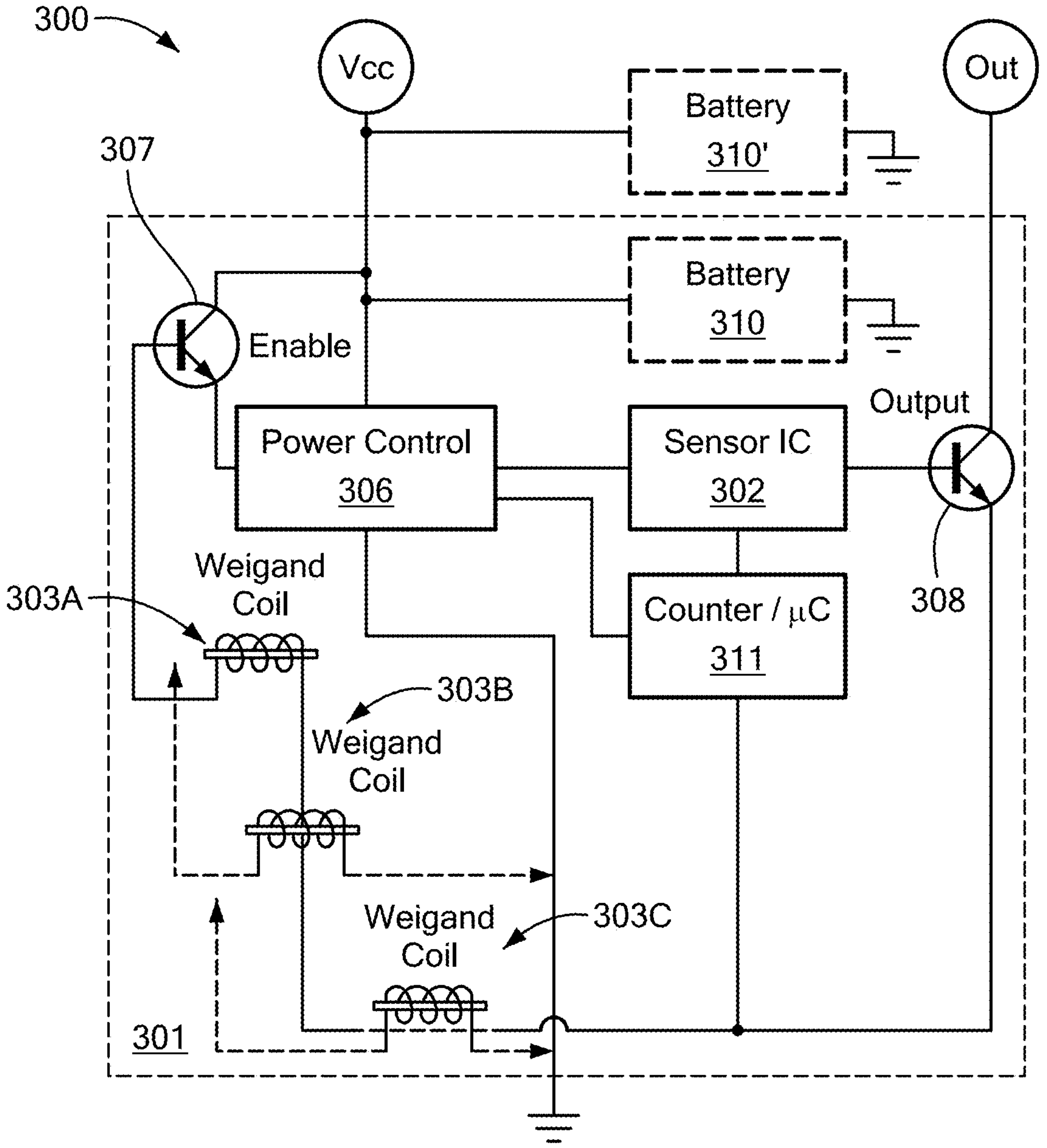
FIG. 3 shows a circuit diagram of an example low-power sensor including a group of three Wiegand coils, in accordance with the present disclosure.

FIG. 3 shows a circuit diagram of an example low-power sensor 300 including a group of Wiegand coils 303A-303C, in accordance with the present disclosure. It will be understood that, while three Wiegand coils 303A-303C are shown for the group (plurality), different numbers of Wiegand coils (or coil structures) may be used in other embodiments of the present disclosure.

As shown, sensor 300 can include a substrate 301 (e.g., a PCB) on which one or more sensors or sensing elements 302 are disposed. Multiple Wiegand sensors 303A-303C, each including a coil configured (wound) about a Wiegand wire, can be included, as shown. One or more of the Wiegand sensors 303A-303C can be connected to a switch 307, which can be connected to sensor 302. An output switch (transistor) 308 can also be included, as shown. Sensor 300 can be included in a package (not shown), e.g., having a package body including encapsulant and/or molding material that encapsulates or over-molds sensor 300. While sensor 302 is indicated as being disposed on/in an integrated circuit (IC), a sensor may be a discrete sensor that is not disposed on or in a related IC. Any suitable type of sensor may be used for sensor 302; examples include but are not limited to temperature sensors, magnetic field sensors (magnetic field sensing elements), pressure sensors, force sensors, among others.

In some embodiments, sensor 300 can include or be connected to a battery 310, which may be disposed on substrate 301 or located remotely from substrate 301, as indicated by alternate battery position 310'. In some embodiments, a counter and/or microcontroller 311 may be included. For example, a simple CMOS counter 311 may be used to count pulses from one or more of the Wiegand coils, in some embodiments. In other embodiments, a microcontroller 311 may be employed; in some embodiments a microcontroller 311 may be connected to the power control block 306, the sensor IC 302 and/or the Wiegand coil(s) 303A-303C.

Figure 4:
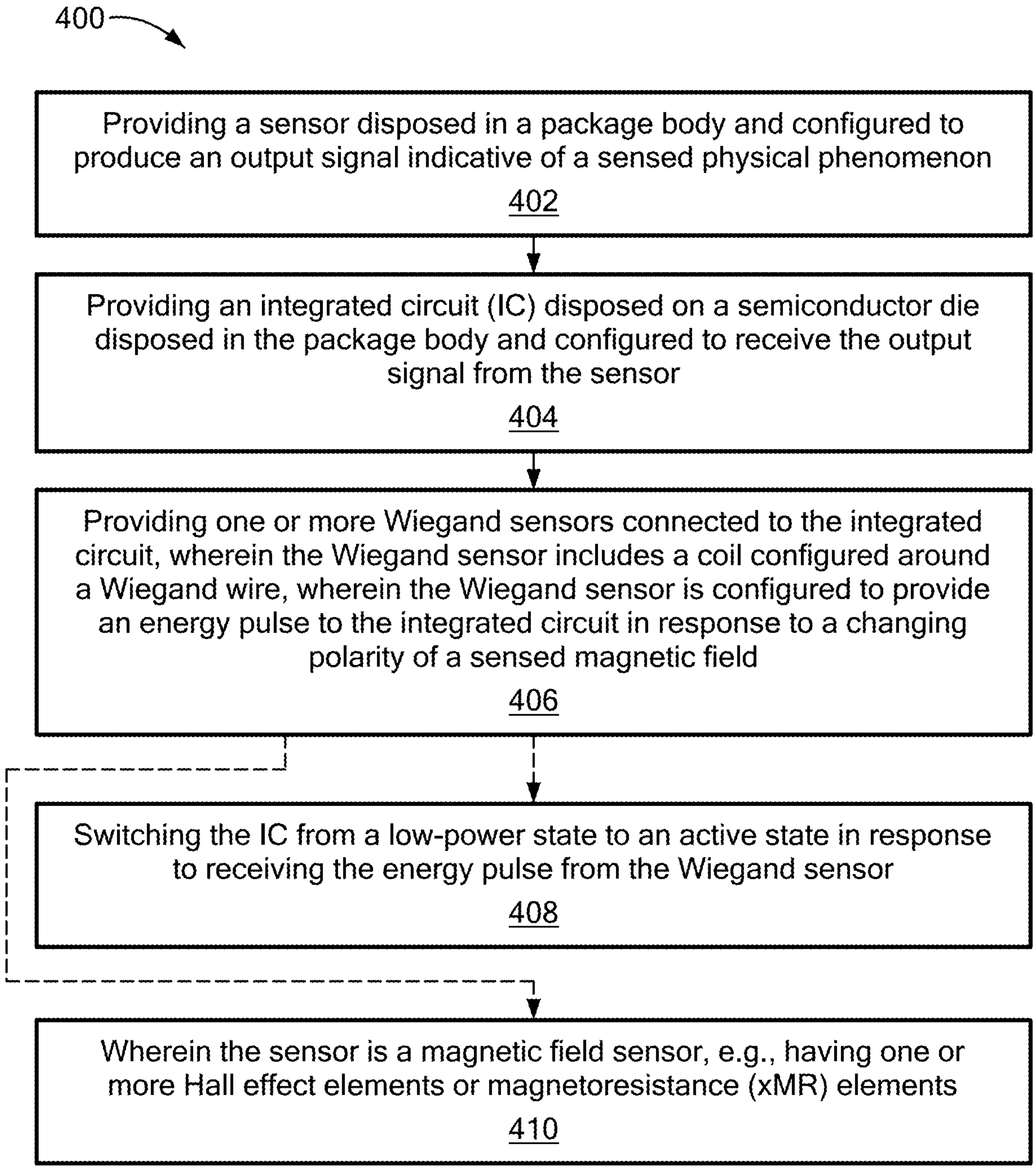
FIG. 4 is a diagram showing steps in an example method of making a low-power sensor utilizing a Wiegand coil, in accordance with the present disclosure.

FIG. 4 is a diagram showing steps in an example method 400 of making a low-power sensor utilizing a Wiegand coil, in accordance with the present disclosure. Method 400 can include providing a sensor disposed in a package body and configured to produce an output signal indicative of a sensed physical phenomenon, as described at 402. An integrated circuit (IC) can be provided that is disposed on a semiconductor die disposed in the package body and configured to receive the output signal from the sensor, as described at 404. One or more Wiegand sensors (coils) can be provided that are connected to the integrated circuit, where the Wiegand sensor includes a coil configured around a Wiegand wire, with the Wiegand sensor being configured to provide an energy pulse to the integrated circuit in response to a changing polarity of a sensed magnetic field, as described at 406.

As an optional step in method 400, the IC can be switched from a low-power state to an active state in response to receiving an energy pulse from the one or more Wiegand sensors, as described at 408. As another option, the sensor can be a magnetic field sensor in some embodiments, e.g., a magnetic field sensor having one or more Hall effect elements or magnetoresistance (xMR) elements, as described at 410.

Figure 5:
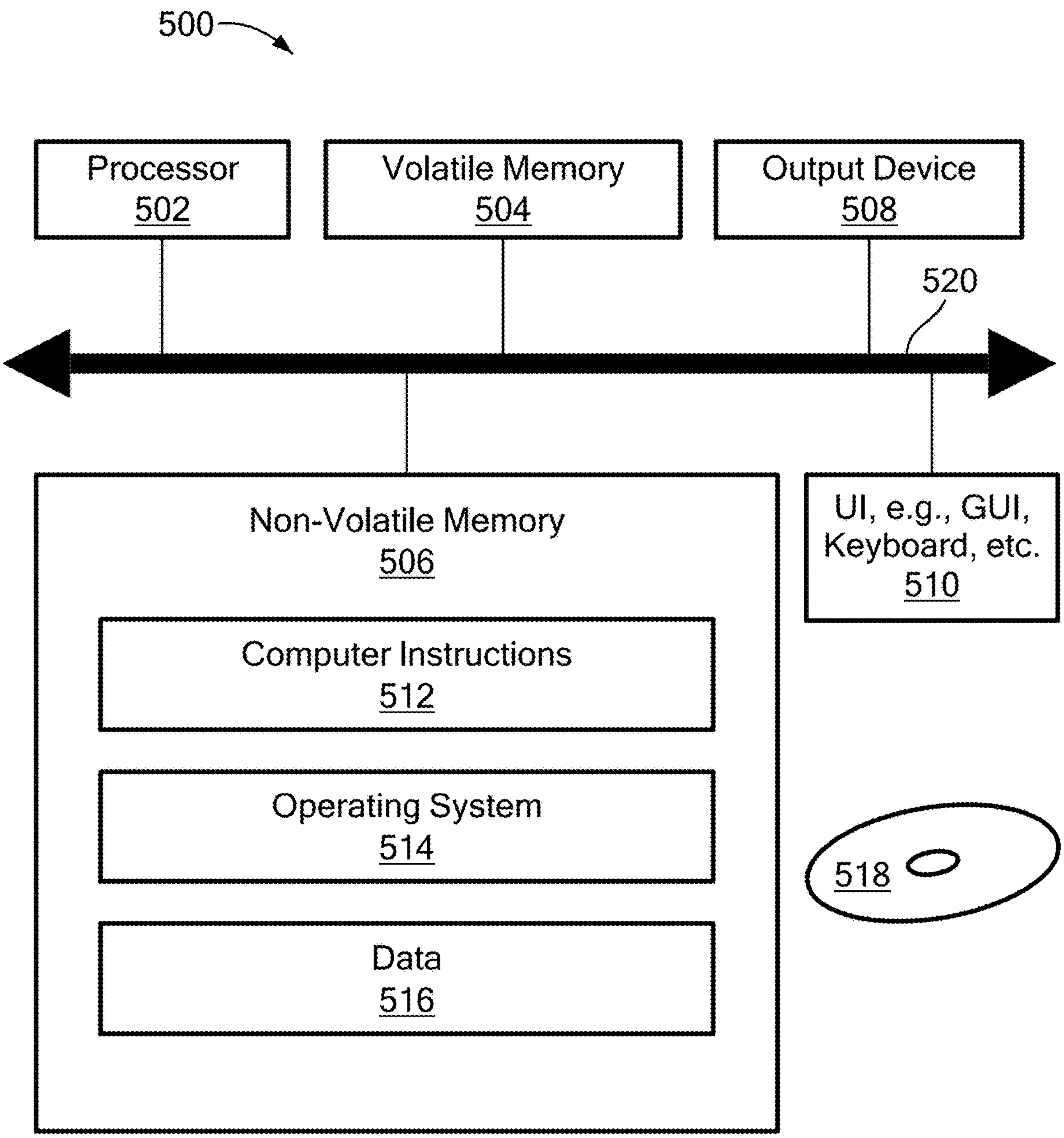
FIG. 5 is a schematic diagram of an example computer system that can perform all or at least a portion of methods, algorithms, and processing, in accordance with the present disclosure.

FIG. 5 is a schematic diagram of an example computer system 500 that can perform all or at least a portion of the processing, e.g., steps in the algorithms and methods, including determination of magnitude, direction, temperature, time (duration), magnetic field polarity change, and/or location of or associated with a sensed physical phenomenon, as described herein. The computer system 500 can includes a processor 502, a volatile memory 504, a non-volatile memory 506 (e.g., hard disk), an output device 508 and a user input or interface (UI) 510, e.g., graphical user interface (GUI), a mouse, a keyboard, a display, and/or any common user interface, etc. The non-volatile memory (non-transitory storage medium) 506 stores computer instructions 512 (a.k.a., machine-readable instructions or computer-readable instructions) such as software (computer program product), an operating system 514 and data 516. In one example, the computer instructions 512 are executed by the processor 502 out of (from) volatile memory 504. In one embodiment, an article/apparatus 518 (e.g., a storage device or medium such as a hard disk, an optical disc, magnetic storage tape, optical storage tape, flash drive, etc.) includes or stores the non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., port or bus) to perform processing and to generate output information.

The system 500 can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as special purpose logic circuitry, e.g., an FPGA (field programmable gate array) and/or an ASIC (application-specific integrated circuit).

Accordingly, embodiments of the inventive subject matter can afford various benefits relative to prior art techniques. For example, aspects, embodiments and examples of the present disclosure can provide devices, IC packages, and sensors that can be activated and/or powered for use by one or more included Wiegand coils (sensors); these can include low-power devices and/or sensors.

Embodiments of the present disclosure can provide sensors and/or devices that can be low-power or very-low-power sensors and/or devices. Single or multiple Wiegand coils can be used for detecting magnetic fields produced by moving magnets or magnetic targets. For example, single or multiple coils configured in an X-plane and/or a Y-plane can be used to sense rotation. A device powered on can detect which coil "fired" to count rotations (left or right, totals or fractional, etc.). Such a configuration can utilize, e.g., a very-low-power CMOS counter, without a need for other active sensor circuits. Other embodiments can include an onboard energy storage mechanism, e.g., a battery, for the device. In some embodiments, a battery of some form may be deposited on a substrate or IC used with the Wiegand coil(s). In some embodiments, a battery may be co-packaged with a sensor and/or associated Wiegand coils. In some embodiments, Wiegand coils can both provide charge and be used for basic detection.

Embodiments of the present disclosure can provide sensors and/or devices that can operate as essentially "zero power" devices, obtaining needed operational power from the ambient environment. For example, single or multiple Wiegand coils and be used in layouts to harness energy form a "constantly moving" system. This can be used to power a device for different operational parameters. For example, one sensor can be run at first certain RPM, while another sensor can be run at a second RPM, etc. The sensor(s) can be passive devices where a Wiegand coil "fires" an output, resulting in an output frequency that changes relative to (or, alternatively, in step with) rotational speed. This could have multiple "generation" thresholds to detect different "speeds" of the system. For example, a flow meter with a rotating element sensing flow volume, could produce an output including a pulse width modulation (PWM) relative to the speed of rotation and or number of Wiegand coils and locations. In some embodiments, a battery may be co-packaged with a sensor and/or associated Wiegand coils. In some embodiments, Wiegand coils can both provide charge and be used for basic detection.

Various embodiments of the concepts, systems, devices, structures, and techniques sought to be protected are described above with reference to the related drawings. Alternative embodiments can be devised without departing from the scope of the concepts, systems, devices, structures, and techniques described. While emphasis is provided above on devices that use Wiegand coils for powering sensors, other devices and/or components may be used instead of or in addition to sensors. For example, devices in accordance with present disclosure can include wireless communication devices (e.g., including transmitters, receivers, and/or transceivers) that are coupled to one or more Wiegand coils.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, which includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc.; though, where context admits, those terms may indicate fractional values. The term "plurality" indicates any integer or fractional number greater than one. The term "connection" can include an indirect "connection" and a direct "connection."

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases do not necessarily refer to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the scope of the following claims.

All publications and references cited in this patent are expressly incorporated by reference in their entirety.

What is claimed is:

1. A sensor package comprising:

a sensor disposed in a package body and configured to produce an output signal indicative of a sensed physical phenomenon;

an integrated circuit (IC) disposed on a semiconductor die disposed in the package body and configured to receive the output signal from the sensor; and a Wiegand sensor connected to the integrated circuit, wherein the Wiegand sensor includes a coil configured around a Wiegand wire, wherein the Wiegand sensor is configured to provide an energy pulse to the integrated circuit in response to a changing polarity of a sensed magnetic field, and wherein the coil of the Wiegand sensor is configured to reset the Wiegand wire to a known domain state after powerup to have a known North-to-South transition or South-to-North transition to be detected.

2. The sensor package of claim 1, wherein the sensor is disposed in the IC.

3. The sensor package of claim 1, wherein the sensor package is disposed apart from the IC.

4. The sensor package of claim 1, wherein the IC is configured to switch from a low-power state to an active state in response to receiving the energy pulse from the Wiegand sensor.

5. The sensor package of claim 4, wherein the IC is configured to stay in the active state until receiving an off command.

6. The sensor package of claim 4, wherein the IC is configured to stay in the active state for a specified time.

7. The sensor package of claim 6, wherein the specified time is in accordance with a duty cycle.

8. The sensor package of claim 1, wherein the Wiegand sensor is disposed on the semiconductor die.

9. The sensor package of claim 1, wherein the Wiegand sensor comprises a discrete element disposed in the package body.

10. The sensor package of claim 1, wherein the Wiegand sensor comprises two or more coils configured to detect change in polarity of a sensed magnetic field in two or more respective directions.

11. The sensor package of claim 1, wherein the sensor comprises a magnetic field sensor.

12. The sensor package of claim 11, wherein the magnetic field sensor comprises one or more Hall effect elements.

13. The sensor package of claim 11, wherein the magnetic field sensor comprises one or more magnetoresistance (xMR) elements.

14. The sensor package of claim 13, wherein the one or more xMR elements comprise one or more tunneling magnetoresistance (TMR) elements.

15. The sensor package of claim 13, wherein the one or more xMR elements comprise one or more anisotropic magnetoresistance (AMR) elements.

16. The sensor package of claim 13, wherein the one or more xMR elements comprise one or more giant magnetoresistance (GMR) elements.

17. The sensor package of claim 1, wherein the IC comprises one or more memories.

18. The sensor package of claim 17, wherein the one or more memories comprise magnetic random access memory (MRAM).

19. The sensor package of claim 1, further comprising a storage mechanism disposed in the package body and configured to store energy for use by the IC and/or sensor.

20. The sensor package of claim 19, wherein the storage mechanism comprises a battery disposed in the package body.

21. The sensor package of claim 20, wherein the battery is disposed in the IC.

22. The sensor package of claim 1, wherein the Wiegand sensor is configured to harvest energy from a host system producing one or more changing magnetic fields.

23. The sensor package of claim 22, wherein the Wiegand sensor comprises one or more Wiegand coils, each configured to detect a changing magnetic field and produce a corresponding output signal.

24. The sensor package of claim 23, wherein each changing magnetic field is produced by relative motion between the respective Wiegand coil and a moving magnetic target of a host system.

25. The sensor package of claim 24, wherein the host system comprises a moving system with one or more moving components having angular motion, wherein each Wiegand coil of the Wiegand sensor is configured for operation at a respective frequency corresponding to the one or more moving components of the host system.

26. A method of making a sensor package, the method comprising:

providing a sensor disposed in a package body and configured to produce an output signal indicative of a sensed physical phenomenon;

providing an integrated circuit (IC) disposed on a semiconductor die disposed in the package body and configured to receive the output signal from the sensor; and providing a Wiegand sensor connected to the integrated circuit, wherein the Wiegand sensor includes a coil configured around a Wiegand wire, wherein the Wiegand sensor is configured to provide an energy pulse to the integrated circuit in response to a changing polarity of a sensed magnetic field;

wherein the IC is configured to switch from a low-power state to an active state in response to receiving the energy pulse from the Wiegand sensor, wherein the IC is configured to stay in the active state for a specified time, and wherein the specified time is in accordance with a duty cycle.

27. The method of claim 26, wherein the Wiegand sensor is disposed on the semiconductor die.

28. The method of claim 26, wherein the Wiegand sensor comprises a discrete element disposed in the package body.

29. The method of claim 26, wherein the Wiegand sensor comprises two or more coils configured to detect change in polarity of a sensed magnetic field in two or more respective directions.

30. The method of claim 26, wherein the sensor comprises a magnetic field sensor.

31. The method of claim 30, wherein the magnetic field sensor comprises one or more Hall effect elements.

32. The method of claim 30, wherein the magnetic field sensor comprises one or more magnetoresistance (xMR) elements.

33. The method of claim 26, wherein the sensor is disposed in the IC.

34. The method of claim 26, wherein the sensor is disposed apart from the IC.

35. The method of claim 26, wherein the coil of the Wiegand sensor is configured to reset the Wiegand wire to a known domain state after powerup to have a known North-to-South transition or South-to-North transition to be detected.

36. The method of claim 26, further including configuring the coil to reset the Wiegand wire to a known domain state after powerup.

37. A sensor package comprising:

a sensor disposed in a package body and configured to produce an output signal indicative of a sensed physical phenomenon;

an integrated circuit (IC) disposed on a semiconductor die disposed in the package body and configured to receive the output signal from the sensor; and a Wiegand sensor connected to the integrated circuit, wherein the Wiegand sensor includes a coil configured around a Wiegand wire, wherein the Wiegand sensor is configured to provide an energy pulse to the integrated circuit in response to a changing polarity of a sensed magnetic field;

wherein the IC is configured to switch from a low-power state to an active state in response to receiving the energy pulse from the Wiegand sensor, wherein the IC is configured to stay in the active state for a specified time, and wherein the specified time is in accordance with a duty cycle.

* * * * *